(12) United States Patent
Derhacobian et al.

(10) Patent No.: US 6,519,182 B1
(45) Date of Patent: Feb. 11, 2003

(54) USING HOT CARRIER INJECTION TO CONTROL OVER-PROGRAMMING IN A NON-VOLATILE MEMORY CELL HAVING AN OXIDE-NITRIDE-OXIDE (ONO) STRUCTURE

(75) Inventors: Narbeh Derhacobian, Belmont, CA (US); Daniel Sobek, Portola Valley, CA (US)

(73) Assignee: Advanced Micro Devices, INc., Sunnyvale, CA (US)

( * ) Notice: Subject to any disclaimer, the term of this patent is extended or adjusted under 35 U.S.C. 154(b) by 0 days.

(21) Appl. No.: 09/902,332

(22) Filed: Jul. 10, 2001

Related U.S. Application Data
(60) Provisional application No. 60/217,137, filed on Jul. 10, 2000.

(51) Int. Cl.[7] .............................................. G11C 16/04
(52) U.S. Cl. ............................ 365/185.18; 365/185.19; 365/185.28

(58) Field of Search ....................... 365/185.18, 185.19, 365/185.14, 185.28; 257/316; 438/264

(56) References Cited

U.S. PATENT DOCUMENTS

| | | | |
|---|---|---|---|
| 4,173,766 A | 11/1979 | Hayes | 357/23 |
| 5,077,691 A | 12/1991 | Haddad | 365/218 |
| 5,349,221 A | 9/1994 | Shimoji | 257/324 |
| 5,991,201 A | * 11/1999 | Kuo et al. | 365/185.18 |
| 6,057,192 A | * 5/2000 | Colabella | 257/316 |

* cited by examiner

*Primary Examiner*—David Lam
(74) *Attorney, Agent, or Firm*—Fliesler Dubb Meyer & Lovejoy LLP (57) ABSTRACT

A programming operation using hot carrier injection is performed on a non volatile memory cell having an oxide-nitride-oxide structure by applying a first train of voltage pulses to he drain and a second train of voltage pulses to the gate. The programming method of the present invention prevents over-programming, minimizes programming time, and increases memory cell endurance and reliability.

28 Claims, 4 Drawing Sheets

USING HOT CARRIER INJECTION TO CONTROL OVER-PROGRAMMING IN A NON-VOLATILE MEMORY CELL HAVING AN OXIDE-NITRIDE-OXIDE (ONO) STRUCTURE

STATEMENT OF PRIORITY

This Application claims priority to Provisional Application Ser. No. 60/217,137, filed Jul. 10, 2000, entitled "USING HOT CARRIER INJECTION TO CONTROL OVER-PROGRAMMING IN A NON-VOLATILE MEMORY CELL HAVING AN OXIDE-NITRIDE-OXIDE (ONO) STRUCTURE."

BACKGROUND OF THE INVENTION

1. Field of Invention

The present invention relates to a non-volatile memory, and more particularly, to a method of using hot carrier injection to control over-programming in a non-volatile memory cell having an oxide-nitride-oxide (ONO) structure.

2. Discussion of Background

Numerous non-volatile memory devices have been developed by the semiconductor industry for various computer and digital communications applications. In particular, a variety of non-volatile memory devices with oxide-nitride-oxide (ONO) structures have been developed. An example of a typical non-volatile memory cell with an ONO structure comprises a semiconductor substrate with source and drain regions, a channel region formed close to the surface of the semiconductor substrate between the source and the drain when electrical conduction occurs between the source and the drain, an oxide-nitride-oxide (ONO) film on top of the substrate surface between the source and the drain, and a gate on top of the ONO film. The ONO film comprises three layers including a first oxide layer on top of the substrate surface between the source and the drain, a nitride layer on top of the first oxide layer, and a second oxide layer on top of the nitride layer. The nitride layer in the ONO film is capable of trapping electrons which are generated in the channel region of the semiconductor substrate during a programming operation.

The conventional non-volatile memory cell with an ONO structure is programmed by generating hot electrons in the vicinity of the drain region in the substrate and injecting the hot electrons into the ONO film. More specifically, the hot electrons are injected into a portion of the nitride layer near the drain of the non-volatile memory cell. Thereafter, since the nitride layer is an insulator, the hot electrons tend to remain in the portion of the nitride layer near the drain without dispersing into, for example, the center of the nitride layer.

The presence of the trapped hot electrons in the portion of the nitride layer adjacent to the drain signifies that at least the drain side of the non-volatile memory cell is "programmed." The non-volatile memory cell with a typical ONO structure may be programmed by applying high positive voltages to the gate and the drain regions while grounding the source of the non-volatile memory cell. This results in hot electrons being injected into the portion of the nitride layer adjacent to the drain. This technique is commonly referred to as hot electron injection or channel hot electron programming.

Figure 1:
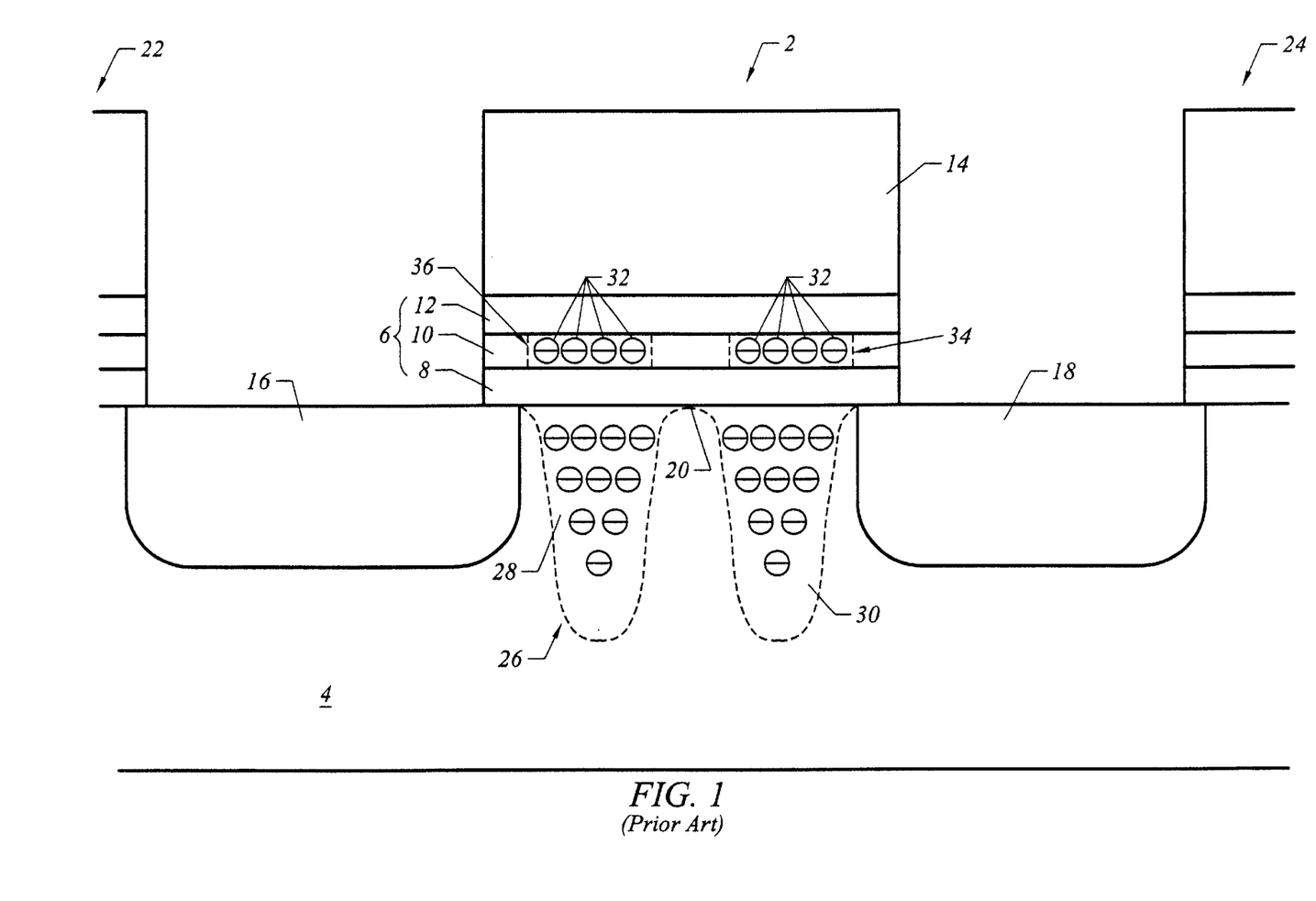
FIG. 1, described above, is a cross-sectional view of a non-volatile memory cell having an oxide-nitride-oxide (ONO) structure illustrating a typical electrical charge distribution in the substrate and the presence of hot electrons trapped in portions of the nitride layer adjacent the drain and source regions after a typical programming operation.

FIG. 1 shows a cross-sectional view of a non-volatile memory cell 2 which comprises a substrate 4, an oxide-nitride-oxide (ONO) film 6 comprising a first oxide layer 8 on top of the substrate 4, a nitride layer 10 of top of the first oxide layer 8, and a second oxide layer 12 on top of the nitride layer 10. A polysilicon gate 14 is provided on top of the second oxide layer 12. Portions of the substrate 4 are doped with a group V element, such as arsenic, to form a source region 16 and a drain region 18. The source and drain regions 16 and 18 may be produced by implanting arsenic into the substrate 4 to a depth in the range of about 300 Å to about 600 Å. The ONO film 6 is positioned on top of a surface portion 20 of the substrate 4 between the source region 16 and the drain region 18.

The first oxide layer 8, which is also called a tunnel oxide layer, is positioned directly on top of the surface portion 20 of the substrate 4 between the source region 16 and the drain region 18. When conduction occurs between the source region 16 and the drain region 18, a channel is formed in the substrate 4 close to the surface 20 between the source region 16 and the drain region 18. The first oxide layer 8 may have a thickness on the order of about 75 Å.

The nitride layer 10, which is positioned on top of the first oxide layer 8, is capable of trapping hot electrons 32 generated in the channel and injected into portions 34, 36 of the nitride layer 10 near the drain region 18 during a typical programming operation. The nitride layer 10 may have a thickness on the order of about 75 Å. The second oxide layer 12, which is positioned on top of the nitride layer 10, has a thickness typically on the order of about 100 Å. The polysilicon gate 14, which is positioned on top of the second oxide layer 12, may be a conventional polysilicon gate which serves as a control gate for the non-volatile memory cell 2. The ONO film 6, which comprises the first oxide layer 8, the second oxide layer 12 and the nitride layer 10 sandwiched between the first and second oxide layers 8 and 12, may be fabricated by using conventional techniques known to a person skilled in the art.

FIG. 1 further shows portions of cross-sectional views of additional memory cells 22 and 24 adjacent to the non-volatile memory cell 2 in a non-Docket volatile memory array. The non-volatile memory cells 22 and 24 each have device structures identical to the non-volatile memory cell 2 described above. Further, adjacent non-volatile memory cells share a common arsenic-doped region which serves as the drain for one cell and as the source for the other cell. For example, the arsenic-doped region 16, which serves as the source for the non-volatile memory cell 2, also serves as the drain for the non-volatile memory cell 22. Similarly, the arsenic-doped region 18, which serves as the drain for the non-volatile memory cell 2, also serves as the source for the non-volatile memory cell 24.

FIG. 1 further shows a typical electron charge distribution in the substrate 4 after a typical programming operation in which channel hot electrons are generated in the substrate 4 and then injected and subsequently trapped in the nitride layer 10. After the non-volatile memory cell 2 is programmed, negative charge is formed in the portion of the substrate 4 beneath the substrate surface 20 between the source region 16 and the drain region 18. During the channel hot electron programming operation, electrons trapped in this substrate region have an electron charge distribution that is dependent upon the gate and drain voltages applied to the non-volatile memory cell 2 and the doping profiles for the source region 16 and the drain region 18.

More specifically, FIG. 1 shows an example of a typical electron charge distribution 26 in the portion of the substrate 4 between the source region 16 and the drain region 18 of the non-volatile memory cell 2 in which both the drain side and the source side are programmed using channel hot electron programming. The negative charge in the substrate 4 is relatively concentrated in a first region 28 adjacent to the source region 16 and in a second region 30 adjacent to the drain region 18.

However, hot electron injection is a stochastic or probabilistic event. Under normal operating conditions, hot electrons are most likely to be injected into the portion of the nitride layer 10 near the drain and least likely to be injected into the center portion of the nitride layer 10. Under normal operating conditions, very few hot electrons are injected into the center portion of nitride layer 10. The few hot electrons thus trapped in the center portion of nitride layer 10 have a minimal effect on the operating life of the non-volatile memory.

Under over-programming conditions, however, the life of the non-volatile memory cell having an ONO structure may be reduced to as few as several thousand program-erase cycles. Over-programming conditions, such as excessively long programming times or certain combinations of gate and drain bias voltages (e.g., a small differential voltage between the gate and drain voltages), increase the likelihood that hot electrons are injected into the center portion of nitride layer 10 with every programming operation.

For instance, if over-programming conditions were to result in one electron being injected into the center portion of nitride layer 10 every one thousand programming cycles, as opposed to one electron every one hundred thousand programming cycles, then a mere one million programming cycles would result in one thousand electrons being trapped in the center portion of nitride layer 10. The presence of these one thousand electrons, for example, may increase the threshold voltage $V_T$ of the non-volatile memory cell to a point where the cell can no longer be read.

Given certain process variations, the charge trapped in the center portion of nitride layer 10 may be sufficient to cause undesirable shifts in the threshold voltage in as few as several thousand program-erase cycles. Accordingly, there is a need for a method of preventing or limiting over-programming in non-volatile memory cells having ONO structures when hot carriers are used for programming. There is a further need for a method of minimizing the programming time of the non-volatile memory cells having ONO structures while increasing cell endurance and reliability.

SUMMARY OF THE INVENTION

In accordance with the present invention, roughly described, a method for programming a non-volatile memory cell having an oxide-nitride-oxide (ONO) structure comprises the steps of applying a first train of voltage pulses to the drain of the non-volatile memory cell and applying a second train of voltage pulses to the gate of the non-volatile memory cell, the first train of voltage pulses being in phase with the second train of voltage pulses. In one embodiment, the amplitude of successive voltage pulses of at least one of the first and second trains of voltage pulses varies with time. In another embodiment, first and second trains of voltage pulses have variable first and second duty cycles, respectively. In another embodiment, the first and second duty cycles are varied such that the first and second trains of voltage pulses are transformed into corresponding first and second continuous voltage ramps.

BRIEF DESCRIPTION OF THE DRAWINGS

The present invention will be described with respect to particular embodiments thereof, and references will be made to the drawings, in which:

FIG. 5(*a*) illustrates an embodiment of a self-limiting method of programming a non-volatile memory, having an ONO structure, by applying incrementally larger voltage pulses to the drain and incrementally smaller voltage pulses to the gate.

FIG. 5(*b*) illustrates an embodiment of a self-limiting method of programming a non-volatile memory, having an ONO structure, by applying incrementally smaller voltage pulses to the gate while holding voltage pulses applied to the drain at a constant amplitude.

FIG. 5(*c*) illustrates an embodiment of a self-limiting method of programming a non-volatile memory, having an ONO structure, by applying incrementally smaller voltage pulses to the drain while holding voltage pulses applied to the gate at a constant amplitude.

DETAILED DESCRIPTION

Figure 2:
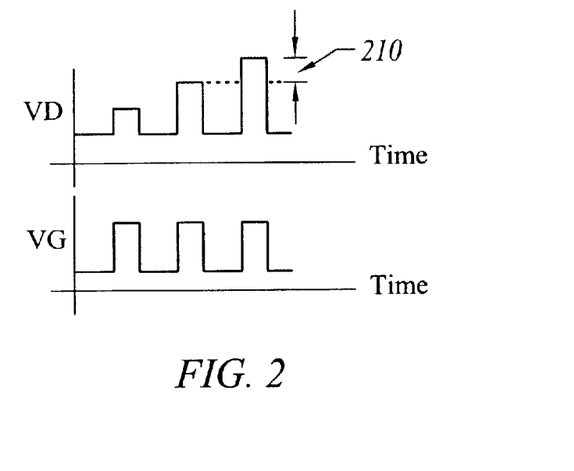
FIG. 2 illustrates a method of programming a non-volatile memory cell having an ONO structure by applying incrementally larger voltage pulses to the drain while holding voltage pulses applied to the gate at a constant amplitude.

FIG. 2 illustrates one embodiment of a method of programming a non-volatile memory cell having an ONO structure in accordance with the present invention. The incremental step programming method of the present invention comprises the steps of applying a first train of voltage pulses to the drain and applying a second train of voltage pulses to the gate, the first train of voltage pulses being in phase with the second train of voltage pulses. In FIG. 2, the amplitude of successive voltage pulses of the first train of voltage pulses is shifted by a positive voltage step 210, while the amplitude of corresponding voltage pulses of the second train of voltage pulses remains constant.

Accordingly, the present invention increases a differential voltage between the drain and the gate of the non-volatile memory cell with each voltage pulse and, over the duration of the programming cycle, maximizes the differential voltage between the gate and the drain. By maximizing this differential voltage, the present invention reduces the risk of over-programming and localizes hot carrier injection to a region of the nitride layer nearest to the drain.

Figure 3:
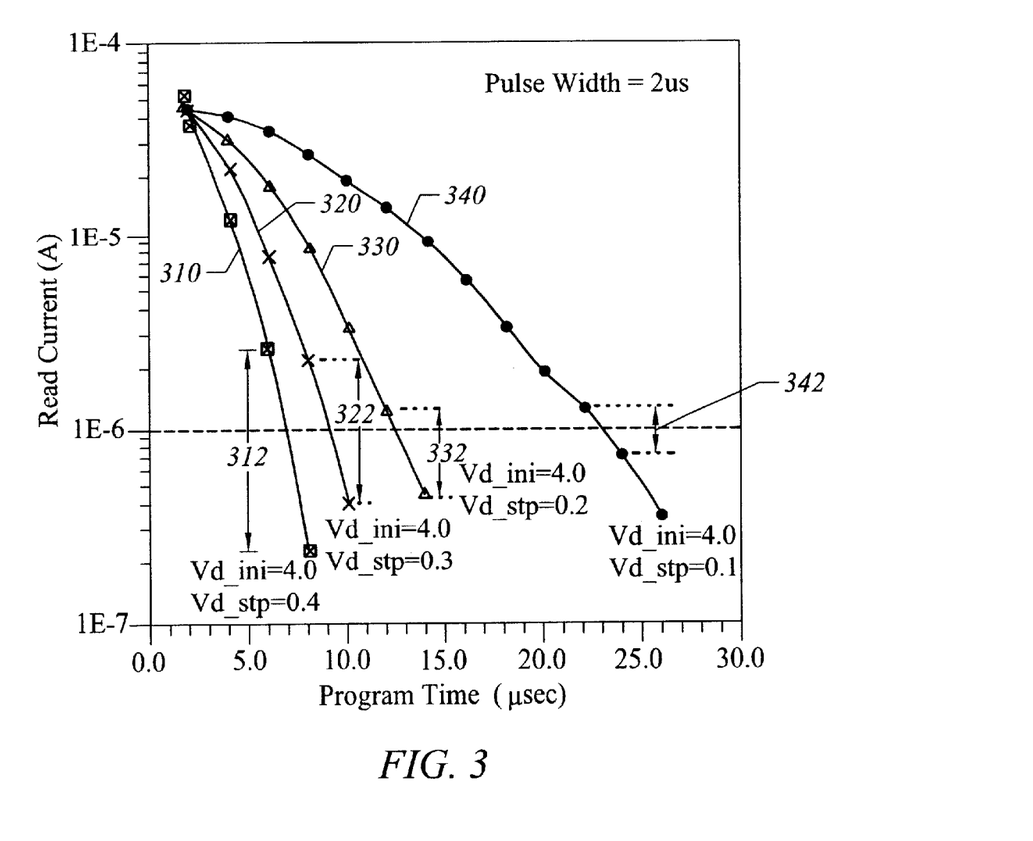
FIG. 3 is a diagram comparing read current versus program time characteristics of a non-volatile memory cell having an ONO structure, the memory cell programmed by applying different voltage pulse trains to the drain.

Recall that when a memory cell having an ONO structure is over-programmed, for example when the differential voltage between the drain and the source is relatively small, hot carriers are more likely to be injected into and trapped in a center portion of the nitride layer. As more and more hot carriers accumulate in the center portion of the nitride (and as the erase sequence is unable to remove all hot carriers trapped in the nitride), the threshold voltage of the cell gradually increases to a point where the cell becomes effectively inoperable. Similarly, hot carriers are less likely to be injected into and trapped in the center of the nitride if hot carrier injection is localized to the region of the nitride layer nearest to the drain. The present invention thus extends the operating life and enhances the reliability characteristics of the memory cell by reducing the risk of over-programming and localizing hot carrier injection to the drain, FIG. 3 illustrates how read current and program time of a non-volatile memory cell are affected by the incremental step programming method of FIG. 2 wherein the amplitude of successive voltage pulses applied to the drain is incremented by various voltage steps. The amplitude of each successive voltage pulse of graph 310 is incremented by a 400 mV step. The amplitude of each successive voltage pulse of graph 320 is incremented by a 300 mV step. The amplitude of each successive voltage pulse of graph 330 is incremented by a 200 mV step. The amplitude of each successive voltage pulse of graph 340 is incremented by a 100 mV step.

If, for example, the memory cell is considered programmed when the read current reaches 1 $\mu$A, the programming conditions associated with graph 310 are "harsh" even though they result in the shortest program time. This is because application of a voltage pulse 312 to the drain causes the memory cell to be programmed well beyond the 1 $\mu$A threshold. In other words, the programming conditions associated with graph 310 cause the memory cell to be over-programmed. As explained earlier, over-programming significantly increases the likelihood that hot carriers will accumulate in the center portion of the nitride layer 10. This is undesirable because it progressively increases the memory cell's threshold voltage, $V_{TH}$, and ultimately shortens its operating life.

The programming conditions associated with graphs 320, 330, and 340 are progressively less harsh. Voltage pulses 322, 332, and 342 are progressively less likely to over-program the memory cell and, thus, the probability that hot carriers will be injected into and remain trapped in the center portion of the nitride layer 10 correspondingly decrease. FIG. 3 demonstrates that the likelihood of over-programming is reduced by reducing the voltage steps or increments between successive voltage pulse amplitudes. Of the programming conditions highlighted in FIG. 3, graph 340 is representative of programming conditions that limit over-programming in accordance with the present invention.

Figure 4:
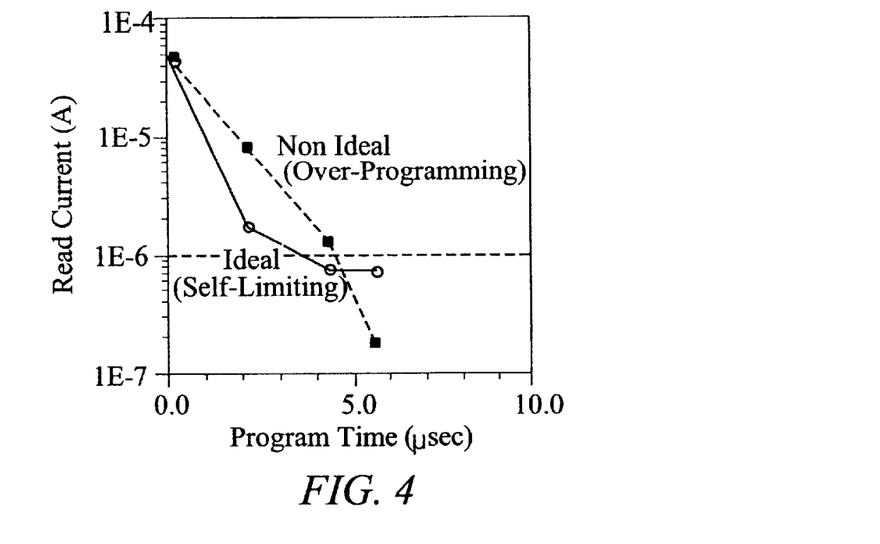
FIG. 4 depicts a chart of read current versus program time illustrating an ideal, self-limiting method of programming a non-volatile memory, having an ONO structure, which minimizes over-programming versus a non-ideal method of programming the non-volatile memory cell which results in over-programming.

FIG. 4 is a chart of read current versus program time illustrating ideal and non-ideal methods of programming a non-volatile memory cell having an ONO structure. Assuming once again that the memory cell is programmed when the read current reaches 1 $\mu$A, the non-ideal method severely over-programs the memory cell even though the program time is desirously short. As explained earlier, over-programming is undesirable because it can significantly shorten the operating life of the memory cell. Graph 310 of FIG. 3 is representative of this non-ideal programming method.

In contrast, the ideal or self-limiting programming method minimizes both the likelihood of over-programming and program time. The self-limiting programming method further improves upon the programming method illustrated earlier by graph 340 of FIG. 3. In addition to reducing the likelihood of over-programming, the self-limiting programming method also minimizes the time required to program the memory cell. This is accomplished by programming the memory cell at a fast rate initially and leveling it off once the memory cell has reached the programmed state.

Figure 5A:
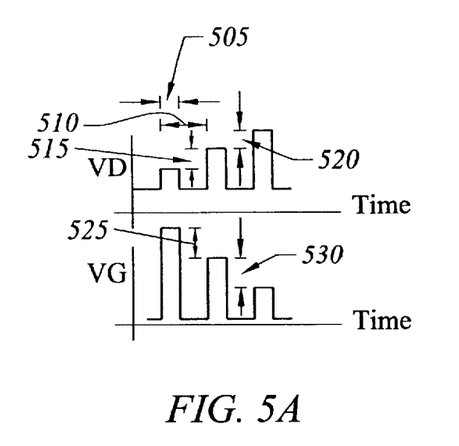

FIG. 5(a) illustrates an embodiment of the self-limiting method of programming a non-volatile memory cell having an ONO structure in accordance with the present invention. In the embodiment of FIG. 5(a), incrementally larger voltage pulses are applied to the drain, $V_D$, while incrementally smaller voltage pulses are applied to the gate, $V_G$. Thus, voltage steps 515 and 520 are positive and voltage steps 525 and 530 are negative. While these voltage steps may typically have the same magnitude, in an embodiment of the present invention, the voltage steps between successive voltage pulses are variable in another embodiment. In other words, the value of voltage step 515 may be different from the value of voltage step 520 and the value of voltage steps 525 may be different from the value of voltage step 530. Indeed, the values of voltage steps 515, 520, 525, and 530 may all be different from one another. For example, in order to program the memory cell at a fast rate initially and level it off once the memory cell has reached the programmed state, voltage step 515 may be 400 mV, voltage step 520 may be 300 mV, voltage step 525 may be 350 mV, and voltage step 530 may be 100 mV.

In addition, a trailing edge of each voltage pulse of the train of voltage pulses applied to the gate extends beyond a trailing edge of each corresponding voltage pulse of the train of voltage pulses applied to the drain of the memory cell. Similarly, a leading edge of each voltage pulse of the train of voltage pulses applied to the gate precedes a leading edge of each corresponding voltage pulse of the train of voltage pulses applied to the drain of the memory cell. Keeping the gate pulses longer than the drain pulses prevents the memory cell from inadvertently entering into an erase cycle.

Figure 5B:
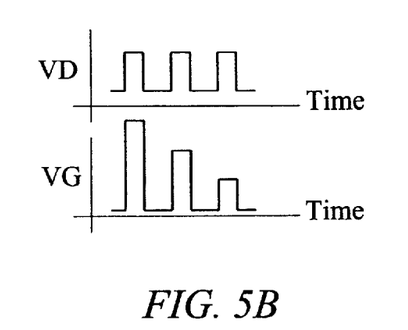

FIG. 5(b) illustrates an embodiment of the self-limiting method of programming a non-volatile memory cell having an ONO structure in accordance with the present invention. In the embodiment of FIG. 5(b), voltage pulses with constant amplitudes are applied to the drain while incrementally smaller voltage pulses are applied to the gate. As with the embodiment of FIG. 5(a), the voltage steps between successive voltage pulses may be variable and the gate pulses are longer than the drain pulses.

Figure 5C:
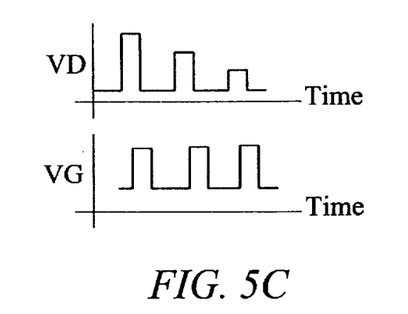

FIG. 5(c) illustrates an embodiment of the self-limiting method of programming a non-volatile memory cell having an ONO structure in accordance with the present invention. In the embodiment of FIG. 5(c), incrementally smaller voltage pulses are applied to the drain while voltage pulses with constant amplitudes are applied to the gate. Again, the voltage steps between successive voltage pulses may be variable and the gate pulses are longer than the drain pulses.

In an embodiment of the present invention, respective duty cycles of the train of voltage pulses applied to the gate and the train of voltage pulses applied to the drain of the memory cell are variable. The duty cycle is defined as the ratio of the pulse duration to the pulse period of a periodic pulse train. Referring to FIG. 5(a), for example, the duty cycle of the train of voltage pulses applied to the drain is the ratio of pulse duration 505 to the pulse period 510. In an embodiment of the present invention, the duty cycle of the train of voltage pulses applied to the gate and the duty cycle of the train of voltage pulses applied to the drain of the memory cell are varied such that both trains of voltage pulses are transformed into continuous voltage ramps.

Using either discrete voltage pulses or continuous voltage ramps, the self-limiting programming method of the present invention maximizes a differential voltage between the drain voltage ($V_D$) and the gate voltage ($V_G$). By maximizing the differential voltage between $V_D$ and $V_G$, hot carrier injection is localized to a region of nitride layer 10 nearest to the drain region 18. This, in turn, minimizes the injection of hot carriers into a center region of nitride layer 10, reduces the likelihood of over-programming, and extends the operating life of the memory cell.

Figure 6:
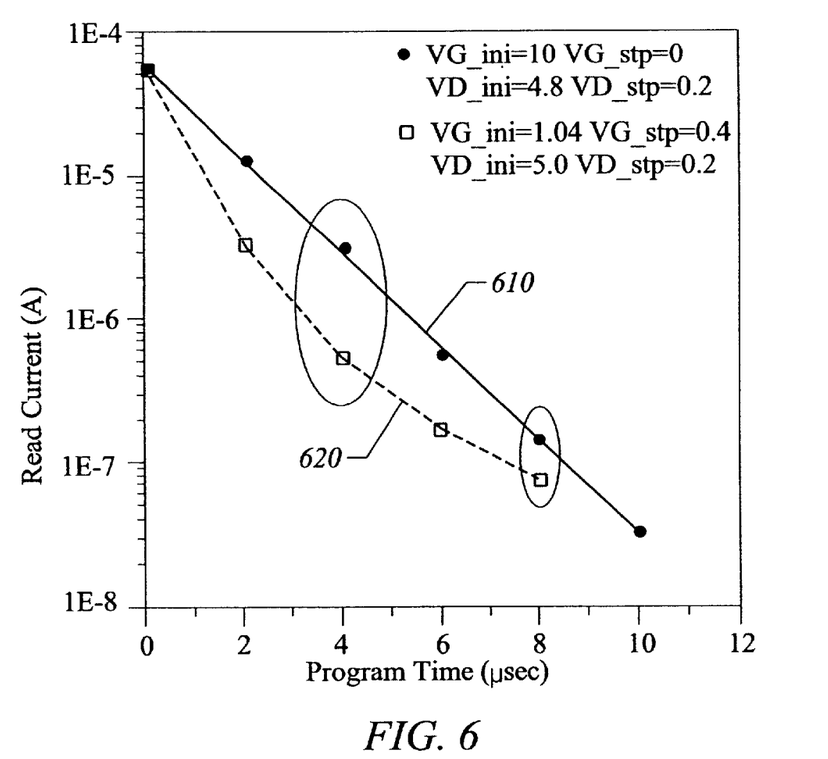
FIG. 6 is a diagram comparing read current versus program time characteristics of a non-volatile memory cell having an ONO structure programmed with the self-limiting method of the present invention.

FIG. 6 further illustrates a non-volatile memory cell, having an ONO structure, programmed with the self-limiting method of FIG. 5(a). Graph 610 results from the application of incrementally larger voltage pulses to the drain while voltage pulses with constant amplitudes are applied to the gate. The amplitude of each successive voltage pulse applied to the drain increases by 200 mV voltage steps. While the memory cell is accordingly programmed in 10 μsec, these programming conditions are likely to result in a high likelihood that hot carriers will be injected into and trapped in a center portion of nitride layer 10. Over time, this over-programming can shift the memory cell's threshold voltage and ultimately shorten the memory cell's operating life.

In contrast, graph 620 results from programming conditions much like those of FIG. 5(a). Specifically, incrementally larger voltage pulses are applied to the drain while incrementally smaller voltage pulses are applied to the gate. The amplitude of each successive voltage pulse applied to the drain increases by 200 mV voltage steps while the amplitude of each successive voltage pulse applied to the gate decreases by 400 mV voltage steps (i.e., $V_{G\_step}$=–400 mV). The result is self-limiting programming method where the programming rate is initially fast but one which levels off once the memory cell has reached the programmed state. The self-limiting method of the present invention, as illustrated by graph 620, thus reduces the likelihood of over-programming while minimizing the time required to program the memory cell.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, continuous voltage ramps may be applied to the gate and drain of the non-volatile memory cell instead of voltage pulses.

The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method of programming a non-volatile memory cell which comprises a drain and a source in a substrate having a surface between the drain and the source, a nitride layer above the surface of the substrate, and a gate above the nitride layer, the method comprising the steps of:
    applying a first train of voltage pulses to the drain;
    applying a second train of voltage pulses to the gate, the first train of voltage pulses being in phase with the second train of voltage pulses; and
    wherein a trailing edge of voltage pulses of the second train of voltage pulses extends beyond a trailing edge of corresponding voltage pulses of the first train of voltage pulses.

2. The method of claim 1, wherein amplitudes of a first voltage pulse, a second voltage pulse, and a third voltage pulse of at least one of the first and second trains of voltage pulses are successively shifted by a voltage step.

3. The method of claim 2, wherein the voltage step is a positive voltage increment.

4. The method of claim 2, wherein the voltage step is a negative voltage increment.

5. The method of claim 1, wherein a first voltage step between a first voltage pulse and a second voltage pulse of at least one of the first and second trains of voltage pulses is different from a second voltage step between the second voltage pulse and a third voltage pulse.

6. The method of claim 1, wherein a leading edge of voltage pulses of the second train of voltage pulses precedes a leading edge of corresponding voltage pulses of the first train of voltage pulses.

7. The method of claim 1, further comprising the step of grounding the source of the non-volatile memory cell.

8. The method of claim 1, further comprising the step of maximizing a differential voltage between the drain and the gate.

9. The method of claim 1, wherein the first train of voltage pulses has a first duty cycle and the second train of voltage pulses has a second duty cycle.

10. The method of claim 9, wherein the first and second duty cycles are variable.

11. The method of claim 10, wherein the first and second duty cycles are varied such that the first and second trains of voltage pulses are transformed into corresponding first and second continuous voltage ramps.

12. The method of claim 1, wherein the non-volatile memory cell further comprises a first oxide layer between the nitride layer and the surface of the substrate.

13. The method of claim 12, wherein the non-volatile memory cell further comprises a second oxide layer between the nitride layer and the gate.

14. The method of claim 1, wherein the gate comprises a polysilicon layer.

15. The method of claim 1, wherein the source and drain comprise arsenic doped regions in the substrate.

16. A method of programming a non-volatile memory cell having an oxide-nitride-oxide structure, the non-volatile memory cell comprising a drain and a source in a substrate, a channel between the drain and the source, a nitride layer above the channel, and a gate above the nitride layer, the method comprising the steps of:
    applying a first train of voltage pulses to the drain;
    applying a second train of voltage pulses to the gate, wherein a trailing edge of voltage pulses of the second train of voltage pulses extends beyond a trailing edge of corresponding voltage pulses of the first train of voltage pulses; and
    maximizing a differential voltage between the first and second trains of voltage pulses.

17. The method of claim 16, wherein the first train of voltage pulses are in phase with the second train of voltage pulses.

18. The method of claim 16, wherein an amplitude of successive voltage pulses of at least one of the first and second trains of voltage pulses is shifted by a voltage step.

19. The method of claim 18, wherein the voltage step is a positive voltage increment.

20. The method of claim 18, wherein the voltage step is a negative voltage increment.

21. The method of claim 16, wherein a first voltage step between a first voltage pulse and a second voltage pulse of the first train of voltage pulses is different from a second voltage step between the second voltage pulse and a third voltage pulse.

22. The method of claim 16, wherein a first voltage step between a first voltage pulse and a second voltage pulse of the second train of voltage pulses is different from a second voltage step between the second voltage pulse and a third voltage pulse.

23. The method of claim 16, wherein a leading edge of voltage pulses of the second train of voltage pulses precedes a leading edge of corresponding voltage pulses of the first train of voltage pulses.

24. The method of claim 16, further comprising the step of grounding the source of the non-volatile memory cell.

25. The method of claim 16, wherein the first train of voltage pulses has a first duty cycle and the second train of voltage pulses has a second duty cycle.

26. The method of claim 25, wherein the first and second duty cycles are variable.

27. The method of claim 26, wherein the first and second duty cycles are varied such that the first and second trains of voltage pulses are transformed into corresponding first and second continuous voltage ramps.

28. The method of claim 16, wherein the gate comprises a polysilicon layer.

* * * * *

UNITED STATES PATENT AND TRADEMARK OFFICE
CERTIFICATE OF CORRECTION

PATENT NO.   : 6,519,182 B1                                              Page 1 of 1
DATED        : February 11, 2003
INVENTOR(S)  : Derhacobian and Daniel Sobek It is certified that error appears in the above-identified patent and that said Letters Patent is hereby corrected as shown below:

<u>Column 8,</u>
Line 56, "t   rain" should be -- train --

Signed and Sealed this

Second Day of September, 2003

JAMES E. ROGAN
*Director of the United States Patent and Trademark Office*